United States Patent [19]

Janutka

[11] Patent Number: 4,477,742
[45] Date of Patent: Oct. 16, 1984

[54] THREE TERMINAL BIDIRECTIONAL DRAIN TO DRAIN FET CIRCUIT

[75] Inventor: William J. Janutka, West Allis, Wis.
[73] Assignee: Eaton Corporation, Cleveland, Ohio
[21] Appl. No.: 390,721
[22] Filed: Jun. 21, 1982
[51] Int. Cl.³ .................... H03K 17/16; H03K 17/687
[52] U.S. Cl. .................................. 307/571; 307/270; 307/577; 307/584
[58] Field of Search ............... 307/499, 501, 246, 249, 307/250, 570, 571–575, 577, 584, 270, 318, 297, 252 A, 252 C, 252 D, 300; 330/288; 363/60

[56] References Cited

U.S. PATENT DOCUMENTS 3,215,859 11/1965 Sorchych ........................... 307/577
3,532,899 10/1970 Huth et al. ......................... 307/572
4,256,979 3/1981 Hendrickson et al. ............. 307/571

Primary Examiner—Stanley D. Miller
Assistant Examiner—David R. Hudspeth
Attorney, Agent, or Firm—Andrus, Sceales, Starke & Sawall

[57] ABSTRACT

A three terminal bidirectional FET circuit is provided by first and second MOSFETs connected drain to drain in series relation between first and second main terminals, and by gating circuitry providing requisite gate drive to a corresponding FET regardless of the polarity of its correspondent main terminal. A current source is connected to a common point between the FET gates, which common gate point is referenced through a resistor and a pair of diodes to the most negative of the main terminals.

7 Claims, 1 Drawing Figure

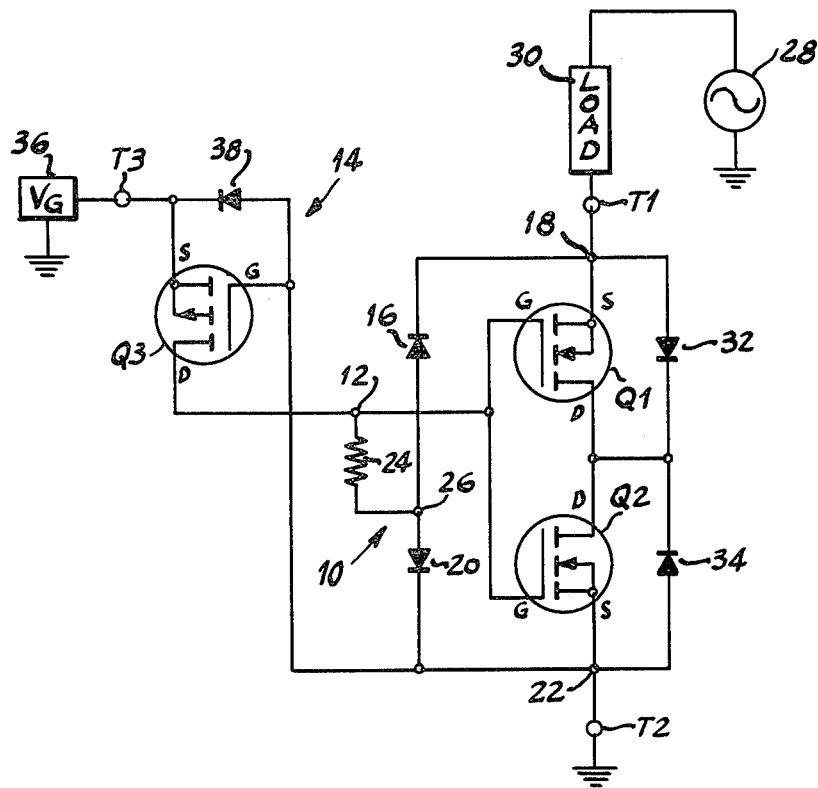

THREE TERMINAL BIDIRECTIONAL DRAIN TO DRAIN FET CIRCUIT

TECHNICAL FIELD

The invention relates to power switching FET circuits, and more particularly to a pair of FETs connected in drain series relation in order to achieve bidirectional current handling capability, and further to gating techniques therefor.

BACKGROUND AND SUMMARY

Power switching field effect transistors (FETs) are well known in the art. A FET is unidirectional and conducts current from one main terminal to another in response to gate drive on a third terminal. This three terminal arrangement is widely accepted, and is compatible with standard circuit applications.

In order to control a load driven by an AC power source, a plural FET arrangement must be bidirectional, i.e. pass current in both directions. It is desirable that a plural FET circuit be a three terminal device which is compatible with most packaging techniques.

The present invention addresses and solves this need in a series drain to drain connected FET circuit with a particularly simple and effective gating arrangement.

The invention is particularly useful in conjunction with subject matter disclosed in copending Application Ser. No. 06/390,719, filed June 21, 1982, wherein a bidirectional FET is constructed with a common depletion region for both directions of current flow.

BRIEF DESCRIPTION OF THE DRAWING

FIG. 1 is a circuit diagram of a three terminal bidirectional FET circuit constructed in accordance with the invention.

DETAILED DESCRIPTION

FIG. 1 shows a three terminal bidirectional FET circuit including first and second enhancement mode FETs Q1 and Q2 connected drain to drain in series relation between first and second main terminals T1 and T2. Resistance means 10 is connected from a common point 12 between the FET gates to each of the main terminals T1 and T2, to reference common gate point 12 to the main terminal of greater given polarity, for example the more negative of the terminals T1 and T2. Current source means 14 is connected to common gate point 12 for driving FETs Q1 and Q2 into conduction. A current source supplies a constant fixed level of current independent of input voltage.

Resistance means 10 comprises a first diode 16 connected at its cathode to a point 18 common to first main terminal T1 and the source of FET Q1. Resistance means 10 comprises a second diode 20 connected at its cathode to a point 22 common to main terminal T2 and the source of Q2. Resistance means 10 also includes a resistor 24 connected at one end to common gate point 12, and connected at the other end to a point 26 common to the anodes of diodes 16 and 20.

FIG. 1 shows the FET circuit connected across an AC power source 28, a load 30 and ground. The inherent reverse characteristic diodes 32 and 34 of FETs Q1 and Q2 are also shown, as is known in the art. When terminal T1 is positive with respect to T2, current flows from terminal T1 through diode 32 then through FET Q2 to terminal T2, when the device is in the ON state. When terminal T1 goes negative, current flows from T2 through diode 34 then through FET Q2 to terminal T1.

Current source 14 comprises a p channel source follower grounded gate MOSFET Q3. The source of Q3 is connected to a gate terminal T3 which is supplied from a gating voltage source 36. The drain of Q3 is connected to common gate point 12. A blocking diode 38 has its anode connected to the gate of Q3, and its cathode connected to the source of Q3.

Diodes 16 and 20 reference resistor 24 to the more negative of terminals T1 and T2. This referenced resistor fixes the gate to source voltage of the corresponding FET Q1 or Q2 according to the product of the fixed current through resistor 24 from current source 14 and the resistance value of resistor 24. Thus, this IR drop establishes the requisite gate to source voltage to drive the corresponding FET Q1 or Q2 into conduction regardless of the polarity of the corresponding main terminal T1 or T2.

It is recognized that various modifications are possible within the scope of the appended claims.

I claim:

1. A bidirectional FET circuit comprising:

first and second enhancement mode FETs connected drain to drain in series relation between first and second power switching terminals, current conduction in one direction traversing through the series connection of the forward biased substrate-drain pn junction of said first FET and the drain-source current path of said second FET, and current conduction in the opposite direction traversing through the series connection of the forward biased pn junction of said second FET and the drain-source current path of said first FET;

resistance means connected from a common node connecting the FET gates to each of said power switching terminals, to reference said node to the power switching terminal of greater given polarity; and current source means connected to said node for driving sid FETs into conduction.

2. The invention according to claim 1 wherein said resistance means comprises:

a first diode connected at one end to a node connecting said first power switching terminal and the first FET source;

a second diode connected at one end to a node connecting said second power switching terminal and the second FET source; and a resistor connected at one end to said first mentioned node, and connected at the other end to a node connecting the other ends of said diodes.

3. The invention according to claim 2 wherein said power switching terminals are connectable to the series connection of an AC power source and a load, said resistor being referenced to the more negative of said power switching terminals through the corresponding one of said diodes, such that said referenced resistor fixes the gate to source voltage of the corresponding FET according to the product of the fixed current through said resistor from said current source means and the resistance value of said resistor, regardless of the polarity of the corresponding power switching terminal.

4. The invention according to claim 3 wherein said current source comprises a source follower mode FET connected between said first mentioned node and a switch control terminal for receiving a control potential, said last mentioned FET having its gate connected to one of said power switching terminals, one of its drain and source connected to said first mentioned node, and the other of its drain and source connected to said switch control terminal.

5. The invention according to claim 4 wherein said last mentioned FET comprises a p channel MOSFET having its gate connected to ground, its drain connected to said first mentioned node, and its source connected to said switch control terminal.

6. The invention according to claim 5 comprising a diode having its anode connected to said last mentioned FET gate and its cathode connected to said last mentioned FET source.

7. A three terminal bidirectional FET circuit comprising:

first and second enhancement mode FETs connected drain to drain in series relation between first and second power switching terminals, said power switching terminals being connectable to the series connection of an AC power source and a load, current conduction in one direction traversing through the series connection of the forward biased substrate-drain pn junction of said first FET and the drain-source current path of said mode FET, and current conduction in the opposite direction traversing through the series connection of the forwad biased pn junction of said second FET and the drain-source current path of said first FET;

resistance means connected from a common node connecting the FET gates to each of said power switching terminals in common with each respective of the FET sources; and current source means connected between a switch control terminal for receiving a control potential and said node for driving said FETs into conduction, said resistance means referencing said node to the power switching terminal of greater given polarity such that the gate to source voltage of the corresponding FET is fixed by the product of the current from said current source means and the resistance value of said resistance means, regardless of the polarity of the corresponding power switching terminal.

* * * * *